(12) United States Patent
Raisbeck et al.

(10) Patent No.: US 11,845,690 B2
(45) Date of Patent: Dec. 19, 2023

(54) PROCESS FOR PREPARING A COATED GLASS SUBSTRATE

(71) Applicant: PILKINGTON GROUP LIMITED, Lathom (GB)

(72) Inventors: Deborah Raisbeck, Burscough (GB); Paul Andrew Skinner, Ashton-in-Makerfield (GB); Hans-Eckhard Leitl, Weiden (DE); Mark John Glynn, St. Helens (GB); David Rimmer, St. Helens (GB); Kevin David Sanderson, Maumee, OH (US)

(73) Assignee: Pilkington Group Limited, Lathom (GB)

( * ) Notice: Subject to any disclaimer, the term of this patent is extended or adjusted under 35 U.S.C. 154(b) by 0 days.

(21) Appl. No.: 17/283,036

(22) PCT Filed: Oct. 8, 2019

(86) PCT No.: PCT/GB2019/052845
§ 371 (c)(1),
(2) Date: Apr. 6, 2021

(87) PCT Pub. No.: WO2020/074877
PCT Pub. Date: Apr. 16, 2020

(65) Prior Publication Data
US 2021/0340059 A1 Nov. 4, 2021

(30) Foreign Application Priority Data
Oct. 8, 2018 (GB) ...................................... 1816381

(51) Int. Cl.
*C03C 17/34* (2006.01)
*C23C 16/30* (2006.01)
*C23C 16/40* (2006.01)

(52) U.S. Cl.
CPC ...... *C03C 17/3435* (2013.01); *C03C 17/3441* (2013.01); *C23C 16/308* (2013.01);
(Continued)

(58) Field of Classification Search
CPC ........................ C03C 17/3441; C03C 17/3435
See application file for complete search history.

(56) References Cited

U.S. PATENT DOCUMENTS

| 6,235,343 B1 | 5/2001 | Joret |
| 2009/0091033 A1* | 4/2009 | Gao .................... C23C 14/0036 257/E21.535 |

(Continued)

FOREIGN PATENT DOCUMENTS

WO 2018146487 A1 8/2018

OTHER PUBLICATIONS

UK Intellectual Property Office, Examination Report under Section 18(3) in Application No. GB1816381.6, dated Mar. 28, 2022, pp. 1-2.

(Continued)

*Primary Examiner* — Alex A Rolland
(74) *Attorney, Agent, or Firm* — Marshall & Melhorn, LLC

(57) ABSTRACT

A chemical vapour deposition process for preparing a coated glass substrate, said process comprising at least the following steps in sequence: a) providing a glass substrate having a surface, b) depositing a layer based on SiCO and/or SiNO on the surface of the glass substrate, c) exposing the layer based on SiCO and/or SiNO to a gaseous mixture (i) comprising water, and d) subsequently depositing a layer based on a TCO over the layer based on SiCO and/or SiNO.

19 Claims, 2 Drawing Sheets

(52) U.S. Cl.
CPC ...... *C23C 16/401* (2013.01); *C03C 2217/211* (2013.01); *C03C 2217/228* (2013.01); *C03C 2217/94* (2013.01); *C03C 2218/152* (2013.01)

(56) References Cited

U.S. PATENT DOCUMENTS

2011/0086235 A1\* 4/2011 Sheel .................... C23C 16/407
              428/448
2013/0025672 A1  1/2013 Auvray

OTHER PUBLICATIONS

European Patent Office, International Search Report with Written Opinion issued in PCT/GB2019/052845, dated Dec. 9, 2019, 8 pages, European Patent Office, Rijswijk, Netherlands.

\* cited by examiner

PROCESS FOR PREPARING A COATED GLASS SUBSTRATE

BACKGROUND OF THE INVENTION

This invention relates to a process for preparing a coated glass substrate.

Photovoltaic (PV) cells or solar cells are material junction devices which convert sunlight into direct current (DC) electrical power. When exposed to sunlight (consisting of energy from photons), the electric field of PV cell p-n junctions separates pairs of free electrons and holes, thus generating a photo-voltage. A circuit from n-side to p-side allows the flow of electrons when the PV cell is connected to an electrical load, while the area and other parameters of the PV cell junction determine the available current. Electrical power is the product of the voltage times the current generated as the electrons and holes recombine.

It is to be understood that in the context of the present invention the term "PV cell" includes any assembly of components generating the production of an electric current between its electrodes by conversion of solar radiation, whatever the dimensions of the assembly, the voltage and the intensity of the produced current, and whether or not this assembly of components presents one or more internal electrical connection(s) (in series and/or parallel). The term "PV cell" within the meaning of the present invention is thus here equivalent to "photovoltaic device" or "photovoltaic panel", as well as "photovoltaic module", "solar cell" or "solar panel".

A PV cell joins n-type and p-type materials, with a layer in between known as a junction. Even in the absence of light, a small number of electrons move across the junction from the n-type to the p-type semiconductor, producing a small voltage. In the presence of light, photons dislodge a large number of electrons, which flow across the junction to create a current which can be used to power electrical devices.

Traditional PV cells use silicon in the n-type and p-type layers. The newest generation of thin-film PV cell uses thin layers of cadmium telluride (CdTe), amorphous or microcrystalline silicon, or copper indium gallium deselenide (CIGS) instead.

The semiconductor junctions are formed in different ways, either as a p-i-n device in amorphous silicon (a-Si), or as a hetero-junction (e.g. with a thin cadmium sulphide layer that allows most sunlight to pass through) for CdTe and CIGS. In their simplest form, a-Si cells suffer from significant degradation in their power output (in the range 15-35%) when exposed to the sun. Better stability requires the use of thinner layers, however, this reduces light absorption and hence cell efficiency. This has led the industry to develop tandem and even triple junction devices that contain p-i-n cells stacked on top of each other.

Generally a transparent conductive oxide (TCO) layer forms the front electrical contact of a thin film photovoltaic cell, and a metal layer forms the rear contact. The TCO may be based on doped zinc oxide (e.g. ZnO:Al [ZAO] or ZnO:B), tin oxide doped with fluorine ($SnO_2$:F) or an oxide material of indium and tin (ITO). These materials are deposited chemically, such as for example by chemical vapour deposition ("CVD"), or physically, such as for example by vacuum deposition by magnetron sputtering.

The TCO layer may be deposited as part of a stack of layers on a glass substrate. A base layer, adjacent to the glass substrate, is generally provided to enable colour suppression and to prevent the migration of sodium ions into any overlying layers. $SnO_2$ and $SiO_2$ have been utilised as base layers but an alternative material is SiCO (silicon oxycarbide) which has advantages in terms of durability and a reduction in the level of void defects. However, when a SiCO base layer is deposited in an inert atmosphere, e.g. inside a float bath, an overlying TCO layer may exhibit higher sheet resistance than is desired for a photovoltaic cell. Therefore it would be advantageous to provide a process that at least alleviates this problem.

According to a first aspect of the present invention there is provided a chemical vapour deposition process for preparing a coated glass substrate, said process comprising at least the following steps in sequence:
  a) providing a glass substrate having a surface,
  b) depositing a layer based on SiCO and/or SiNO on the surface of the glass substrate,
  c) exposing the layer based on SiCO and/or SiNO to a gaseous mixture (i) comprising water, and
  d) subsequently depositing a layer based on a TCO over the layer based on SiCO and/or SiNO.

It has surprisingly been found that treating the layer based on SiCO and/or SiNO with a gaseous mixture (i) comprising water before depositing a layer based on a TCO improves (i.e. lowers) the sheet resistance that the layer based on a TCO exhibits.

In the context of the present invention, where a layer is said to be "based on" a particular material or materials, this means that the layer predominantly consists of the corresponding said material or materials, which means typically that it comprises at least about 50 at. % of said material or materials.

In the following discussion of the invention, unless stated to the contrary, the disclosure of alternative values for the upper or lower limit of the permitted range of a parameter, coupled with an indication that one of said values is more highly preferred than the other, is to be construed as an implied statement that each intermediate value of said parameter, lying between the more preferred and the less preferred of said alternatives, is itself preferred to said less preferred value and also to each value lying between said less preferred value and said intermediate value.

Throughout this specification, the term "comprising" or "comprises" means including the component(s) specified but not to the exclusion of the presence of other components. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, when referring to compositions, a composition consisting essentially of a set of components will comprise less than 5% by weight, typically less than 3% by weight, more typically less than 1% by weight of non-specified components.

The term "consisting of" or "consists of" means including the components specified but excluding other components.

Whenever appropriate, depending upon the context, the use of the term "comprises" or "comprising" may also be taken to include the meaning "consists essentially of" or "consisting essentially of", and also may also be taken to include the meaning "consists of" or "consisting of".

References herein such as "in the range x to y" are meant to include the interpretation "from x to y" and so include the values x and y.

In the context of the present invention the "thickness" of a layer is, for any given location at a surface of the layer, represented by the distance through the layer, in the direction of the smallest dimension of the layer, from said location at a surface of the layer to a location at an opposing surface of said layer.

In the context of the present invention a transparent material or a transparent substrate is a material or a substrate that is capable of transmitting visible light so that objects or images situated beyond or behind said material can be distinctly seen through said material or substrate.

In the context of the present invention a "derivative" is a chemical substance related structurally to another chemical substance and theoretically derivable from it.

Preferably the layer based on SiCO and/or SiNO is a layer based on SiCO.

Preferably exposing the layer based on SiCO and/or SiNO to a gaseous mixture (i) comprising water in step c) thereby incorporates oxide ions into the layer based on SiCO and/or SiNO.

Preferably step c) occurs without the deposition of a further layer onto the layer based on SiCO and/or SiNO.

Preferably the gaseous mixture (i) also comprises oxygen. Alternatively or additionally, between steps c) and d) the layer based on SiCO and/or SiNO may be exposed to a gaseous mixture (iii) comprising oxygen.

Preferably the gaseous mixture (i) consists essentially of, more preferably consists of, water, oxygen and optionally an inert gas. Most preferably the gaseous mixture (i) consists of water, oxygen and an inert gas.

Preferably the process consists essentially of, preferably consists of, the steps in sequence as set out in the first aspect.

Preferably the gaseous mixture (i) comprises a ratio of water to oxygen of at least 1.5:1 by volume, more preferably at least 3:1 by volume, even more preferably at least 4:1 by volume, most preferably at least 5.5:1 by volume; but preferably at most 50:1 by volume, more preferably at most 10:1 by volume, even more preferably at most 7:1 by volume, most preferably at most 6:1 by volume.

In a preferred embodiment the gaseous mixture (i) comprises 25% to 65% by volume water and 2% to 20% by volume oxygen. More preferably the gaseous mixture (i) comprises 40% to 50% by volume water and 5% to 10% by volume oxygen.

The gaseous mixture (i) preferably also comprises an inert gas such as nitrogen or helium or mixtures thereof. Preferably the inert gas is nitrogen. Thus, the process may comprise providing a source of the one or more inert gases from which separate supply lines may extend. Preferably the gaseous mixture (i) also comprises at least 25% to 65% by volume inert gas such as nitrogen, more preferably 40% to 50% by volume inert gas such as nitrogen.

Preferably in step c) the water is delivered at a flow rate of at least 50 slm (standard litres per minute), more preferably at least 100 slm, even more preferably at least 150 slm, most preferably at least 190 slm; but preferably at most 350 slm, more preferably at most 300 slm, even more preferably at most 250 slm, most preferably at most 210 slm.

Preferably in step c), where present, the oxygen is delivered at a flow rate of at least 15 slm, more preferably at least 20 slm, even more preferably at least 25 slm, most preferably at least 30 slm; but preferably at most 55 slm, more preferably at most 50 slm, even more preferably at most 45 slm, most preferably at most 40 slm. Preferably oxygen is delivered into gaseous mixture (iii) at a flow rate of at least 15 slm, more preferably at least 20 slm, even more preferably at least 25 slm, most preferably at least 30 slm; but preferably at most 55 slm, more preferably at most 50 slm, even more preferably at most 45 slm, most preferably at most 40 slm.

Preferably in step c), where present, the inert gas such as nitrogen is delivered at a flow rate of at least 50 slm (standard litres per minute), more preferably at least 100 slm, even more preferably at least 150 slm, most preferably at least 190 slm; but preferably at most 350 slm, more preferably at most 300 slm, even more preferably at most 250 slm, most preferably at most 210 slm.

The process may be carried out in conjunction with the manufacture of the glass substrate, preferably a transparent glass substrate. In an embodiment, the transparent glass substrate may be formed utilizing the well-known float glass manufacturing process. In this embodiment, the transparent glass substrate may also be referred to as a glass ribbon. The preferred method of chemical vapour deposition (CVD) is atmospheric pressure CVD (e.g. online CVD as performed during the float glass process). However, it should be appreciated that the process can be utilised apart from the float glass manufacturing process or well after formation and cutting of the glass ribbon.

Conveniently the process may be carried out either in a float bath, in an annealing lehr or in a lehr gap. The lehr gap is defined as the region between a float bath and an annealing lehr. In the lehr gap the ambient atmosphere may change from a reducing atmosphere of a float bath to an oxidizing (air ambient) atmosphere in the annealing lehr.

Preferably step b) is carried out in a non-oxidising atmosphere. In the context of the present invention the term "non-oxidising atmosphere" means an atmosphere that does not contain an oxidising agent such as oxygen, hydrogen peroxide or a halogen. Preferably step b) is carried out in a float bath. More preferably both steps b) and c) are carried out in a float bath. Even more preferably steps b), c) and d) are all carried out in a float bath.

Preferably step b) is carried out by exposing the surface of the glass substrate to a gaseous mixture (ii) comprising a silicon source, a carbon source and an oxygen source.

Preferably the silicon source is a silane, such as monosilane, dimethylsilane or disilane, preferably monosilane.

Preferably the carbon source is an unsaturated hydrocarbon compound, such as an ethylenically unsaturated hydrocarbon compound (for example ethylene), an acetylenically unsaturated compound (for example acetylene) or an aromatic compound (for example toluene), although it is generally most convenient to use an unsaturated hydrocarbon which is gaseous under ambient conditions. The unsaturated hydrocarbon is preferably an olefin, conveniently an olefin containing 2 to 4 carbon atoms. Ethylene is especially preferred.

The oxygen source may be a gaseous oxide such as carbon dioxide, carbon monoxide, water vapour, sulphur dioxide and the oxides of nitrogen (nitrous oxide, nitric oxide or nitrogen dioxide) and olefin oxides especially ethylene oxide. Preferably the oxygen source is carbon dioxide.

Further examples of an oxygen source are organic oxygen containing compounds including carbonyl compounds (especially ketones and aldehydes), ethers and alcohols. It is generally most convenient to use a compound which has a vapour pressure of at least 10 mm at room temperature, and for this reason it is therefore usual for any oxygen containing organic compound used to contain not more than 8, and preferably not more than 4, carbon atoms.

The gaseous mixture (ii) preferably also comprises an inert gas such as nitrogen or helium or mixtures thereof. Preferably the inert gas is nitrogen.

Preferably the layer based on a TCO is deposited directly on to the layer based on SiCO. Alternatively, said layer based on a TCO may be deposited indirectly on to the layer based on SiCO and/or SiNO i.e. said layer based on a TCO may be deposited over one or more layers that were previously deposited over the layer based on SiCO and/or SiNO. For example, said layer based on a TCO may be deposited over a layer based on tin oxide and/or over a layer based on silica. Thus step d) may further comprise depositing one or more layers over the layer based on SiCO and/or SiNO before the layer based on a TCO is deposited.

Preferably the layer based on a TCO comprises one or more of fluorine doped tin oxide ($SnO_2$:F), zinc oxide doped with aluminium, gallium or boron (ZnO:Al, ZnO:Ga, ZnO:B), indium oxide doped with tin (ITO), cadmium stannate, ITO:ZnO, ITO:Ti, $In_2O_3$, $In_2O_3$—ZnO (IZO), $In_2O_3$:Ti, $In_2O_3$:Mo, $In_2O_3$:Ga, $In_2O_3$:W, $In_2O_3$:Zr, $In_2O_3$:Nb, $In_{2-2x}M_xSn_xO_3$ with M being Zn or Cu, ZnO:F, $Zn_{0.9}Mg_{0.1}$O:Ga, and (Zn,Mg)O:P, ITO:Fe, $SnO_2$:Co, $In_2O_3$:Ni, $In_2O_3$:(Sn, Ni), ZnO:Mn, and ZnO:Co. Preferably said layer based on a TCO is based on fluorine doped tin oxide ($SnO_2$:F). Most preferably said layer based on a TCO is fluorine doped tin oxide ($SnO_2$:F).

Preferably step d) is carried out by exposing the layer based on SiCO and/or SiNO, or another layer if one or more layers have been deposited over the layer based on SiCO and/or SiNO before the layer based on a TCO is deposited, to a gaseous mixture (iv). For the deposition of $SnO_2$:F, preferably gaseous mixture (iv) comprises dimethyl tin dichloride (DMT), oxygen, steam and a source of fluorine, such as HF or trifluoroacetic acid. More preferably gaseous mixture (iv) also comprises an inert gas such as nitrogen.

The process may preferably be carried out when the transparent glass substrate is at a temperature in the range 450° C. to 800° C., more preferably when the transparent glass substrate is at a temperature in the range 550° C. to 770° C. Depositing a CVD coating when the transparent glass substrate is at these preferred temperatures affords greater crystallinity of the coating, which can improve toughenability (resistance to heat treatment).

Preferably step b) is carried out when the transparent glass substrate is at a temperature of at least 670° C., more preferably at least 700° C., even more preferably at least 710° C., most preferably at least 720° C., but preferably at most 770° C., more preferably at most 750° C., even more preferably at most 740° C., most preferably at most 730° C.

Preferably step c) is carried out when the transparent glass substrate is at a temperature of at least 640° C., more preferably at least 670° C., even more preferably at least 680° C., most preferably at least 690° C., but preferably at most 760° C., more preferably at most 740° C., even more preferably at most 730° C., most preferably at most 700° C.

Preferably step d) is carried out when the transparent glass substrate is at a temperature of at least 610° C., more preferably at least 640° C., even more preferably at least 660° C., most preferably at least 665° C., but preferably at most 710° C., more preferably at most 690° C., even more preferably at most 680° C., most preferably at most 675° C.

In certain embodiments, the CVD process is a dynamic process in which the glass substrate is moving at the time of steps b), c) and d). Preferably, the glass substrate moves at a predetermined rate of, for example, greater than 3 m/min during steps b), c) and/or d). More preferably the glass substrate is moving at a rate of between 3 m/min and 20 m/min during steps b), c) and/or d).

As detailed above, preferably the process may be carried out during the float glass production process at substantially atmospheric pressure. Alternatively the process may be carried out using low-pressure CVD or ultrahigh vacuum CVD. The CVD may be carried out using aerosol assisted CVD or direct liquid injection CVD. Furthermore, the CVD may be carried out using microwave plasma-assisted CVD, plasma-enhanced CVD, remote plasma-enhanced CVD, atomic layer CVD, combustion CVD (flame pyrolysis), hot wire CVD, metalorganic CVD, rapid thermal CVD, vapour phase epitaxy, or photo-initiated CVD. The glass substrate will usually be cut into sheets after step d) (and before deposition of any PVD coatings) for storage or convenient transport from the float glass production facility to a vacuum deposition facility.

As would be appreciated by those skilled in the art, precursor compounds suitable for use in any gaseous mixtures used in this process should be suitable for use in a CVD process. Such compounds may at some point be a liquid or a solid but are volatile such that they can be vaporised for use in a gaseous mixture. Once in a gaseous state, the precursor compounds can be included in a gaseous stream and utilized in the process. For any particular combination of gaseous precursor compounds, the optimum concentrations and flow rates for achieving a particular deposition rate and coating thickness may vary.

In certain embodiments, gaseous mixtures are fed through a coating apparatus and discharged from the coating apparatus utilizing one or more gas distributor beams prior to each of steps b), c) and d). Preferably, each gaseous mixture is formed prior to being fed through the coating apparatus. For example, the precursor compounds may be mixed in a feed line connected to an inlet of the coating apparatus. In other embodiments, one or more gaseous mixture may be formed within the coating apparatus.

One or more gaseous mixture may be directed toward and along the glass substrate. Utilising a coating apparatus aids in directing one or more gaseous mixture toward and along the glass substrate. Preferably, one or more gaseous mixture is directed toward and along the glass substrate in a laminar flow.

Preferably, the coating apparatus extends transversely across the glass substrate and is provided at a predetermined distance thereabove. The coating apparatus is preferably located at, at least, one predetermined location. When the process is utilised in conjunction with the float glass manufacturing process, the coating apparatus is preferably provided within the float bath section thereof. However, the coating apparatus may be provided in the annealing lehr, and/or in the gap between the float bath and the annealing lehr.

It is desirable that the one or more gaseous mixture be kept at a temperature below the thermal decomposition temperature of the precursor compounds to prevent pre-reaction before the mixture reaches the surface of the glass substrate. Within the coating apparatus, the gaseous mixture is maintained at a temperature below that at which it reacts and is delivered to a location near the surface of the glass substrate, the glass substrate being at a temperature above the reaction temperature. The gaseous mixtures of steps b) and d) may react at or near the surface of the glass substrate to form the desired layers thereover.

Preferably the surface of the glass substrate that is coated is the gas side surface. Coated glass manufacturers usually prefer depositing coatings on the gas side surface (as opposed to the tin side surface for float glass) because deposition on the gas side surface can improve the properties of the coating.

Preferably said surface of the glass substrate is a major surface of the glass substrate. Preferably the glass substrate is transparent. The transparent glass substrate may be a clear metal oxide-based glass ribbon or pane. Preferably the glass ribbon or pane is a clear float glass ribbon or pane, preferably a low iron float glass ribbon or pane. By clear float glass, it is meant a glass having a composition as defined in BS EN 572-1 and BS EN 572-2 (2004). For clear float glass, the $Fe_2O_3$ level by weight is typically 0.11%. Float glass with an $Fe_2O_3$ content less than about 0.05% by weight is typically referred to as low iron float glass. Such glass usually has the same basic composition of the other component oxides i.e. low iron float glass is also a soda-lime-silicate glass, as is clear float glass. Typically low iron float glass has less than 0.02% by weight $Fe_2O_3$. Alternatively the glass ribbon or pane is a borosilicate-based glass ribbon or pane, an alkali-aluminosilicate-based glass ribbon or pane, or an aluminium oxide-based crystal glass ribbon or pane.

The coated glass substrate preferably exhibits a sheet resistance of at most 21 ohms/sq, more preferably at most 20 ohms/sq, even more preferably at most 19 ohms/sq, most preferably at most 18.5 ohms/sq, but preferably at least 5 ohms/sq, more preferably at least 10 ohms/sq, even more preferably at least 14 ohms/sq, most preferably at least 15 ohms/sq.

The coated glass substrate preferably exhibits a haze, when tested in accordance with ASTM D1003-13, of at least 0.5%, more preferably at least 0.8%, even more preferably at least 1%, most preferably at least 1.2%, but preferably at most 5%, more preferably at most 3%, even more preferably at most 2.5%, most preferably at most 2.3%. These preferred haze values are beneficial for the efficiency of photovoltaic cells.

According to a second aspect of the present invention there is provided the use of water and optionally oxygen to reduce the sheet resistance exhibited by a coated glass substrate prepared by carrying out the process of the first aspect.

Any feature set out above in relation to the first and second aspects of the present invention may also be utilised in relation to any other aspect of the present invention. Any invention described herein may be combined with any feature of any other invention described herein mutatis mutandis. It will be appreciated that optional features applicable to one aspect of the invention can be used in any combination, and in any number. Moreover, they can also be used with any of the other aspects of the invention in any combination and in any number. This includes, but is not limited to, the dependent claims from any claim being used as dependent claims for any other claim in the claims of this application.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

BRIEF DESCRIPTION OF THE DRAWINGS

The invention will now be further described by way of the following specific embodiments, which are given by way of illustration and not of limitation, with reference to the accompanying drawings in which.

DETAILED DESCRIPTION OF THE INVENTION

Figure 1:
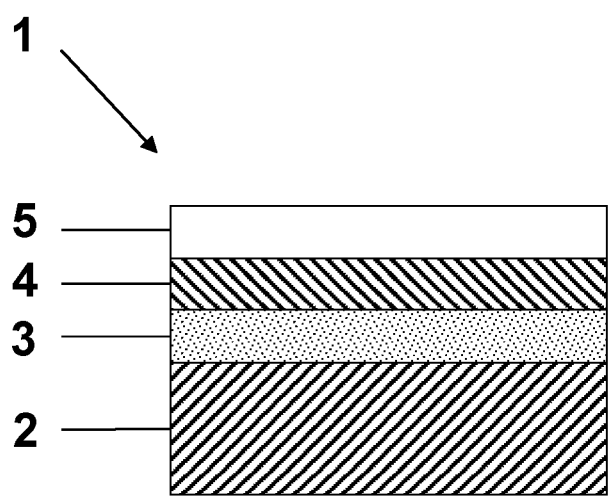
FIG. 1 is a schematic view, in cross-section, of a coated glazing in accordance with the present invention.

FIG. 1 shows a cross-section of a coated glazing 1 according to certain embodiments of the present invention. Coated glazing 1 comprises a transparent float glass substrate 2 that has been sequentially coated using CVD with a layer based on SiCO 3, a layer based on fluorine doped tin oxide ($SnO_2$:F) 4 and a layer based on tin oxide ($SnO_2$) 5.

As discussed above, the process of the present invention may be carried out using CVD in conjunction with the manufacture of the glass substrate in the float glass process. The float glass process is typically carried out utilizing a float glass installation such as the installation 10 depicted in FIG. 2. However, it should be understood that the float glass installation 10 described herein is only illustrative of such installations.

Figure 2:
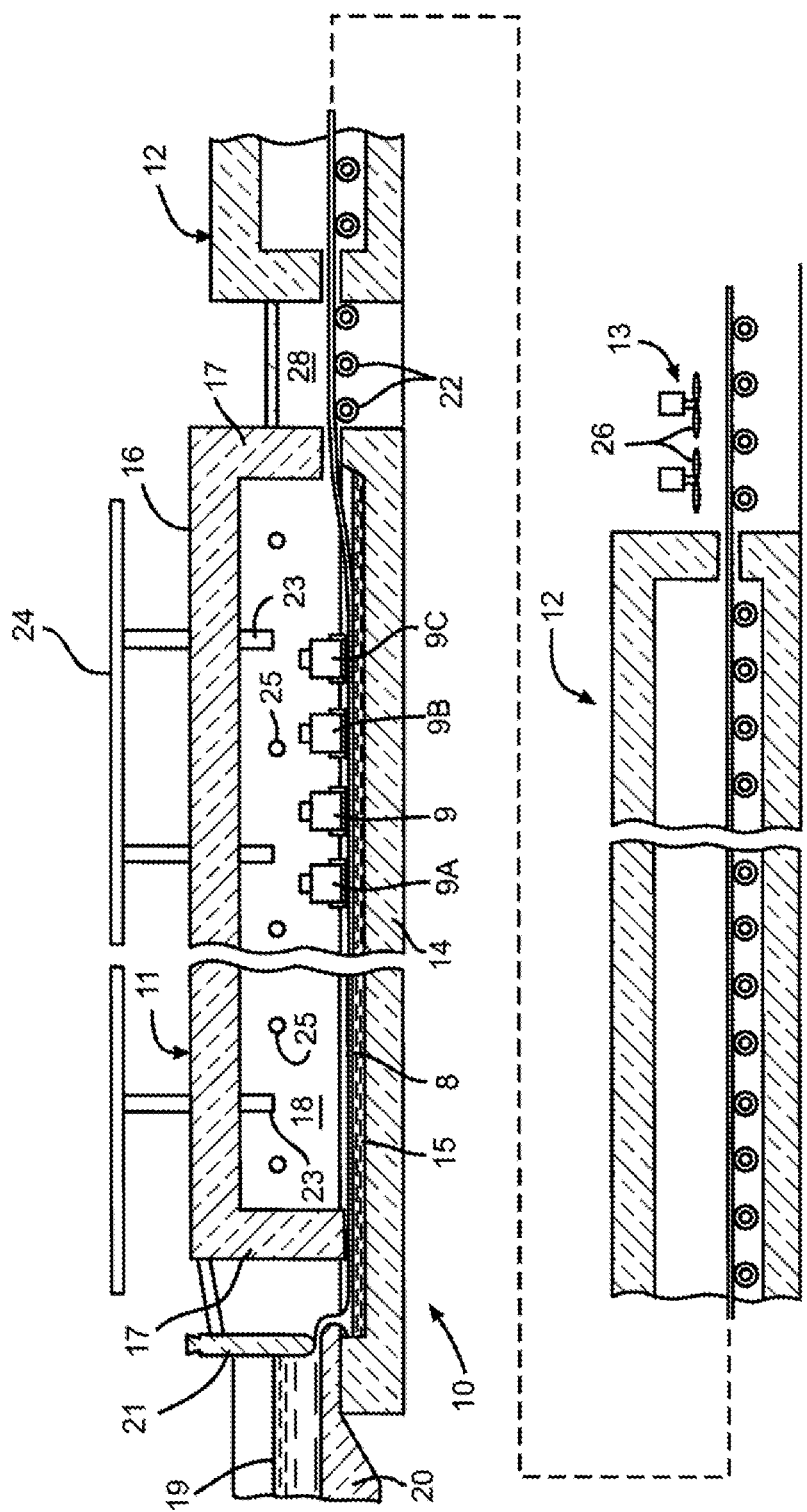
FIG. 2 is a schematic view, in vertical section, of an installation for practicing the float glass process which incorporates several CVD apparatuses for preparing a coated glazing in accordance with the present invention.

As illustrated in FIG. 2, the float glass installation 10 may comprise a canal section 20 along which molten glass 19 is delivered from a melting furnace, to a float bath section 11 wherein the glass substrate is formed. In this embodiment, the glass substrate will be referred to as a glass ribbon 8. However, it should be appreciated that the glass substrate is not limited to being a glass ribbon. The glass ribbon 8 advances from the bath section 11 through an adjacent annealing lehr 12 and a cooling section 13. The float bath section 11 includes: a bottom section 14 within which a bath of molten tin 15 is contained, a roof 16, opposite side walls (not depicted) and end walls 17. The roof 16, side walls and end walls 17 together define an enclosure 18 in which a non-oxidizing atmosphere is maintained to prevent oxidation of the molten tin 15.

In operation, the molten glass 19 flows along the canal 20 beneath a regulating tweel 21 and downwardly onto the surface of the tin bath 15 in controlled amounts. On the molten tin surface, the molten glass 19 spreads laterally under the influence of gravity and surface tension, as well as certain mechanical influences, and it is advanced across the tin bath 15 to form the glass ribbon 8. The glass ribbon 8 is removed from the bath section 11 over lift out rolls 22 and is thereafter conveyed through the annealing lehr 12 and the cooling section 13 on aligned rolls. The deposition of coatings preferably takes place in the float bath section 11, although it may be possible for deposition to take place further along the glass production line, for example, in the gap 28 between the float bath 11 and the annealing lehr 12, or in the annealing lehr 12.

As illustrated in FIG. 2, four CVD apparatuses 9, 9A, 9B, 9C are shown within the float bath section 11. Thus, depending on the frequency and thickness of the coating layers required and the amount of gaseous mixture (i) required in step c) it may be desirable to use some or all of the CVD apparatuses 9, 9A, 9B, 9C. One or more additional coating apparatuses (not depicted) may be provided. One or more CVD apparatus may alternatively or additionally be located in the lehr gap 28. Any by-products are removed through coater extraction slots and then through a pollution control plant. For example, in an embodiment, a SiCO layer is formed utilizing CVD apparatus 9A, a gaseous mixture of water, oxygen and nitrogen is supplied utilizing CVD apparatus 9, and adjacent apparatuses 9B and 9C are utilized to form a fluorine doped tin oxide layer.

A suitable non-oxidizing atmosphere, generally nitrogen or a mixture of nitrogen and hydrogen in which nitrogen predominates, may be maintained in the float bath section 11 to prevent oxidation of the molten tin 15 comprising the float bath. The atmosphere gas is admitted through conduits 23 operably coupled to a distribution manifold 24. The non-oxidizing gas is introduced at a rate sufficient to compensate for normal losses and maintain a slight positive pressure, on the order of between about 0.001 and about 0.01 atmosphere above ambient atmospheric pressure, so as to prevent infiltration of outside atmosphere. For the purposes of describing the invention, the above-noted pressure range is considered to constitute normal atmospheric pressure.

CVD is generally performed at essentially atmospheric pressure. Thus, the pressure of the float bath section 11, annealing lehr 12, and/or in the gap 28 between the float bath 11 and the annealing lehr 12 may be essentially atmospheric pressure. Heat for maintaining the desired temperature regime in the float bath section 11 and the enclosure 18 is provided by radiant heaters 25 within the enclosure 18. The atmosphere within the lehr 12 is typically atmospheric air, as the cooling section 13 is not enclosed and the glass ribbon 8 is therefore open to the ambient atmosphere. The glass ribbon 8 is subsequently allowed to cool to ambient temperature. To cool the glass ribbon 8, ambient air may be directed against the glass ribbon 8 by fans 26 in the cooling section 13. Heaters (not shown) may also be provided within the annealing lehr 12 for causing the temperature of the glass ribbon 8 to be gradually reduced in accordance with a predetermined regime as it is conveyed therethrough.

EXAMPLES

All layer depositions and exposures of layers to water or water and oxygen were carried out using CVD. All Examples shown in Table 1 below were produced on a float line using a 3.2 mm soda-lime-silica glass substrate. Comparative Examples 1-3 and Examples 4-7 were coated at an average line speed of 11 m/min. The deposition of the base layer of SiCO was carried out at a glass temperature of 725° C. for all Examples. SiCO layers were deposited over the glass surface using a single coater with the following components:

$N_2$ carrier gas, $C_2H_4$, $SiH_4$, and $CO_2$.

$SnO_2$ layers were deposited over the glass surface using a single coater with the following components:

$N_2$ carrier gas, $O_2$, dimethyltin dichloride, and $H_2O$.

$SnO_2$:F layers were deposited over the glass surface using two coaters for each of the Examples with the following components:

$N_2$ carrier gas, $O_2$, dimethyltin dichloride, HF, and $H_2O$.

The exposure of SiCO layers to water or water and oxygen was carried out using a single coater with the following components:

$N_2$ carrier gas, water and optionally $O_2$.

The thicknesses of the layers were as follows: SiCO (30-80 nm), $SnO_2$:F (320-370 nm) & $SnO_2$ (50-100 nm). The haze values of the Examples were measured in accordance with the ASTM D1003-13 standard using a BYK-Gardner Hazemeter. Sheet resistance was measured in accordance with a 4-point probe method using a commercially available 4-point probe.

TABLE 1

Flow rates for SiCO exposure to water or water and oxygen

| Example | Stack | SiCO Exposure | SiCO Exposure Coater Flow Rate (slm) | | |
|---|---|---|---|---|---|
| | | | $N_2$ | $H_2O$ | $O_2$ |
| Comp. Ex. 1 | SiCO/SnO$_2$:F/SnO$_2$ | None | 200 | 0 | 0 |
| Comp. Ex. 2 | SiCO/SnO$_2$:F/SnO$_2$ | None | 200 | 0 | 0 |
| Comp. Ex. 3 | SiCO/SnO$_2$:F/SnO$_2$ | None | 200 | 0 | 0 |
| Ex. 4 | SiCO/SnO$_2$:F/SnO$_2$ | Water/O$_2$ | 200 | 200 | 35 |
| Ex. 5 | SiCO/SnO$_2$:F/SnO$_2$ | Water | 200 | 200 | 0 |
| Ex. 6 | SiCO/SnO$_2$:F/SnO$_2$ | Water/O$_2$ | 200 | 200 | 35 |
| Ex. 7 | SiCO/SnO$_2$:F/SnO$_2$ | Water/O$_2$ | 200 | 200 | 35 |

TABLE 2 a*, b*, sheet resistance and haze exhibited by examples

| Example | SiCO Exposure | a* | b* | Sheet Resistance (ohms/sq) | Haze (%) |
|---|---|---|---|---|---|
| Comp. Ex. 1 | None | 1.41 | 4.34 | 22 | 1.08 |
| Comp. Ex. 2 | None | 1.52 | 2.83 | 21.21 | 0.91 |
| Comp. Ex. 3 | None | 4.63 | 2.67 | 22.3 | 0.91 |
| Ex. 4 | Water/O$_2$ | 3.69 | 3.13 | 17.3 | 1.38 |
| Ex. 5 | Water | 2.23 | 3.56 | 18 | 1.53 |
| Ex. 6 | Water/O$_2$ | 2.71 | 3.29 | 17.3 | 1.39 |
| Ex. 7 | Water/O$_2$ | 2.88 | 4.06 | 17.3 | 1.26 |

As can be seen from the results in Table 2 above, exposing the SiCO layer to water results in an improved (lower) sheet resistance in the final product. The water exposure also provides higher haze which is beneficial for PV cells.

The exposure of the SiCO layer to the combination of both water and oxygen leads to a further reduction in sheet resistance.

The a* and b* values shown in Table 2 demonstrate that suitably neutral colours can be achieved when utilising this technique.

The invention claimed is:

1. A chemical vapour deposition process for preparing a coated glass substrate,
   said process comprising at least the following steps in sequence:
   a) providing a glass substrate having a surface,
   b) depositing a layer based on SiCO and/or SiNO on the surface of the glass substrate,
   c) exposing the layer based on SiCO and/or SiNO to a gaseous mixture (i) comprising water and oxygen, and
   d) subsequently depositing a layer based on a TCO over the layer based on SiCO and/or SiNO;
   wherein the gaseous mixture (i) comprises a ratio of water to oxygen of at least 3:1 by volume;
   wherein in step c) the water is delivered at a flow rate of at least 50 slm; and
   wherein in step c) the oxygen is delivered at a flow rate of at least 15 slm.

2. The process according to claim 1, wherein exposing the layer based on SiCO and/or SiNO to a gaseous mixture (i) comprising water in step c) thereby incorporates oxide ions into the layer based on SiCO and/or SiNO.

3. The process according to claim 1, wherein step c) occurs without the deposition of a further layer onto the layer based on SiCO and/or SiNO.

4. The process according to claim 1, wherein between steps c) and d) the layer based on SiCO and/or SiNO is exposed to a gaseous mixture (iii) comprising oxygen.

5. The process according to claim 1, wherein the gaseous mixture (i) comprises 25% to 65% by volume water and 2% to 20% by volume oxygen.

6. The process according to claim 1, wherein in step c) the water is delivered at a flow rate of at least 100 slm.

7. The process according to any of claim 1, wherein in step c) the oxygen is delivered at a flow rate of at least 20 slm.

8. The process according to claim 1, wherein step b) is carried out in a non-oxidising atmosphere.

9. The process according to claim 1, wherein steps b), c) and d) are all carried out in a float bath.

10. The process according to claim 1, wherein step b) is carried out by exposing the surface of the glass substrate to a gaseous mixture (ii) comprising a silicon source, a carbon source and an oxygen source.

11. The process according to claim 1, wherein the layer based on a TCO is deposited directly on to the layer based on SiCO.

12. The process according to claim 1, wherein step c) is carried out when the transparent glass substrate is at a temperature of at least 640° C.

13. The process according to claim 1, wherein the coated glass substrate exhibits a sheet resistance of at most 21 ohms/sq.

14. The process according to claim 1, wherein the coated glass substrate exhibits a haze, when tested in accordance with ASTM D1003-13, of at least 0.5%.

15. The process according to claim 1, wherein in step c) the water is delivered at a flow rate of at least 150 slm.

16. The process according to claim 1, wherein in step c) the water is delivered at a flow rate of at least 190 slm.

17. The process according to any of claim 1, wherein in step c) the oxygen is delivered at a flow rate of at least 25 slm.

18. The process according to any of claim 1, wherein in step c) the oxygen is delivered at a flow rate of at least 30 slm.

19. The process according to claim 1, wherein step c) is carried out when the transparent glass substrate is at a temperature of at least 670° C.

* * * * *